United States Patent
Cohen et al.

(10) Patent No.: US 8,040,532 B2
(45) Date of Patent: *Oct. 18, 2011

(54) THIN FILMS MEASUREMENT METHOD AND SYSTEM

(75) Inventors: Yoel Cohen, Ness Ziona (IL); Moshe Finarov, Rehovot (IL); Klara Vinokur, Ashdod (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/585,593

(22) Filed: Sep. 18, 2009

(65) Prior Publication Data

US 2010/0010659 A1    Jan. 14, 2010

Related U.S. Application Data

(63) Continuation of application No. 12/068,062, filed on Feb. 1, 2008, now Pat. No. 7,595,896, which is a continuation of application No. 10/606,199, filed on Jun. 26, 2003, now Pat. No. 7,327,476.

(30) Foreign Application Priority Data

Jun. 26, 2002    (IL) .......................................... 150438

(51) Int. Cl.
*G01B 11/28*        (2006.01)
(52) U.S. Cl. ........................................................ 356/630
(58) Field of Classification Search ................... 356/630
See application file for complete search history.

(56) References Cited

U.S. PATENT DOCUMENTS

| | | | |
|---|---|---|---|
| 4,967,370 A | 10/1990 | Stern et al. | |
| 5,393,624 A | 2/1995 | Ushijima | |
| 6,045,433 A | 4/2000 | Dvir et al. | |
| 6,185,322 B1 | 2/2001 | Ishikawa et al. | |
| 6,296,548 B1 * | 10/2001 | Wiswesser et al. | 451/8 |
| 6,297,880 B1 * | 10/2001 | Rosencwaig et al. | 356/369 |
| 6,529,282 B1 * | 3/2003 | Stirton et al. | 356/630 |
| 6,650,424 B2 * | 11/2003 | Brill et al. | 356/601 |
| 6,937,350 B2 * | 8/2005 | Shirley | 356/630 |
| 7,327,476 B2 | 2/2008 | Cohen et al. | |
| 7,595,896 B2 * | 9/2009 | Cohen et al. | 356/630 |
| 2002/0037462 A1 * | 3/2002 | Ogata et al. | 430/30 |
| 2002/0113966 A1 * | 8/2002 | Shchegrov et al. | 356/369 |
| 2002/0127746 A1 * | 9/2002 | Chuang et al. | 438/14 |

FOREIGN PATENT DOCUMENTS

EP        1 017 090 A1    7/2000

\* cited by examiner

*Primary Examiner* — Roy M Punnoose
(74) *Attorney, Agent, or Firm* — The Nath Law Group; Susanne M. Hopkins; Ari G. Zytcer

(57) ABSTRACT

A method and system are presented for use in controlling the processing of a structure. First measured data is provided being indicative of at least one of the following: a thickness ($d_2$) of at least one layer ($L_2$) of the structure W in at least selected sites of the structure prior to the processing of the structure, and a surface profile of the structure prior to processing. An optical measurement is applied to at least the selected sites of the structure after processing and second measured data is generated being indicative of at least one of the following: a thickness of the process structure (d') and a surface profile of the processed structure. The second measured data is analyzed by interpreting it using the first measured data to thereby determine a thickness ($d'_1$ or $d'_2$) of at least one layer of the process structure. This determined thickness is thus indicative of the quality of the processing.

17 Claims, 5 Drawing Sheets

THIN FILMS MEASUREMENT METHOD AND SYSTEM

This is a Continuation Application filed under 35 U.S.C. 120 of U.S. patent application Ser. No. 12/068,062, filed Feb. 1, 2008, a Continuation Application claiming the benefit under 35 U.S.C. 120 of U.S. patent application Ser. No. 10/606,199, filed on Jun. 26, 2003, now U.S. Pat. No. 7,327,476, a Non-Provisional Application which claimed the benefit of Israeli Patent Application No. 150438, filed Jun. 26, 2002, the entire content of each of which is hereby incorporated by reference in its entirety.

FIELD OF THE INVENTION

This invention is generally in the field of optical measurement techniques, and relates to a method and system for thin-film (layers) measurements. The present invention is particularly useful for process control in the manufacture of semiconductor devices.

BACKGROUND OF THE INVENTION

Integrated circuits are multi-layer structures produced by applying a sequence of layer-deposition and patterning processes to a semiconductor wafer. Various steps in the manufacture of semiconductor devices require measurements of thickness or other characteristics (e.g., optical parameters) of each layer in the multi-layer wafer structure.

Optical methods for on-line or integrated measurement of the parameters of dielectric films (e.g., film thickness) are known in the art. Most of these techniques are based on reflectometry in a broadened spectral range, e.g. ranging from DUV to NIR spectral range.

In order to determine the parameters of the uppermost layer in the wafer stack (e.g., thickness of this layer), it is especially important to determine optical properties of each layer (film) of the actual stack after completing all the processing steps. Unfortunately, in cases when measurements are performed on the entire stack including different layers that similarly affect the spectral response of the stack, accurate determination of the properties of each separate layer are almost impossible.

SUMMARY OF THE INVENTION

There is accordingly a need in the art to facilitate measurements in a multi-layered structure, by providing a novel measuring method and system.

The inventors have found that performing measurements on a structure prior to applying a specific processing to the structure is advantageous and actually makes further measuring on the processed structure feasible. A metrology system aimed at controlling a process applied to the structure should thus be designed to be capable of using data obtained with the pre-processing measurements to sufficiently and accurately analyze the post-processing measurements on the same structure.

According to one broad aspect of the present invention, there is provided, a method for use in the controlling processing of a structure, the method comprising:
provided first measured data indicative of at least one of the following: a thickness of at least one layer of the structure in at least selected sites of the structure prior to said processing of the structure, and a surface profile of the structure prior to said processing;
applying optical measurements to at least said selected sites in the structure after said processing and generating second measured data indicative of at least one of the following: a thickness of the processed structure and a surface profile of the processed structure;
analyzing the second measured data by interpreting it using the first measured data to thereby determine a thickness of at least one layer of the processed structure, said determined thickness being indicative of the quality of said processing.

There are two basic types of data obtainable with the pre-processing measurement: "Discrimination" and "Complementary" data. In both cases, the pre-processing measurement on the same sites with the post measurement plus injection of the information are key issues to enable certain type of measurements with the required accuracy.

The first measured data is provided by applying said measurements to the structure prior to said processing, and may present reference data obtained while controlling a previous process applied to the structure.

According to another broad aspect of the present invention, there is provided a method for use in controlling processing of a structure, the method comprising:
providing first optical spectral measured data indicative of at least one of the following: a thickness of at least one layer of the structure in at least selected sites of the structure prior to said processing of the structure, and a surface profile of the structure prior to said processing;
applying optical spectral measurements to at least said selected sites in the structure after said processing and generating second measured data indicative of at least one of the following: a thickness of the processed structure and a surface profile of the processed structure;
analyzing the second measured data by interpreting it using the first measured data to thereby determine a thickness of at least one layer of the processed structure, said determined thickness being indicative of the quality of said processing.

The process to be controlled may be a material removal process or a layer deposition process.

A method for use in controlling a material removal process applied to a multi-layer structure comprises:
providing first optical spectral measured data indicative of a thickness of an uppermost layer of the structure and a thickness of a layer underneath said uppermost layer in at least selected sites of the structure prior to said processing of the structure;
applying optical spectral measurements to at least said selected sites of the structure after said material removal processing of the structure, and generating second measured data indicative of a thickness of the processed structure;
analyzing the second measured data by interpreting it using the first measured data to thereby determine at least a thickness of said underneath layer in the processed structure, said determined thickness being indicative of the quality of said processing.

According to one embodiment of the invention, a method for use in controlling a layer deposition process applied to a structure comprises:
providing first optical spectral measured data indicative of a thickness of a first layer of said structure onto which a second layer is to be deposited;
applying optical spectral measurements to at least selected sites in the structure after said layer deposition processing of the structure, and generating second measured data indicative of a thickness of the processed structure;

analyzing the second measured data by interpreting it using the first measured data to thereby determine a thickness of the deposited layer.

According to another embodiment of the invention, a method for use in controlling a layer deposition process applied to a patterned layer of a structure comprises:

providing first optical spectral measured data indicative of a surface profile of said patterned layer of the structure onto which a second layer is to be deposited;

applying optical spectral measurements to at least selected sites in the structure after said layer deposition processing of the structure, and generating second measured data indicative of a surface profile of the processed structure;

analyzing the second measured data by interpreting it using the first measured data to thereby determine a thickness of the deposited layer.

According to yet another aspect of the invention, there is provided an optical system for use in controlling processing of a multi-layer structure, the system comprising:

an optical device comprising a light source arrangement, a light detector assembly, and a light directing assembly, the optical device being operable to apply optical measurements to the structure and generate data representative of light returned from the structure, said generated data being indicative of at least one of the following: a thickness of at least one layer of the structure, and a surface profile of the structure;

a control unit connectable to the optical device to operate said device and receive said generated data, said control unit having a memory utility for storing first measured data obtained from optical measurements applied to the structure prior to said processing, and having a processor utility preprogrammed to analyze second measured data obtained from the optical measurements applied to the structure after said processing, said analyzing of the second measured data including interpreting the second measured data using the first measured data to thereby determine a thickness of at least one layer of the processed structure, said determined thickness being indicative of the quality of said processing.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
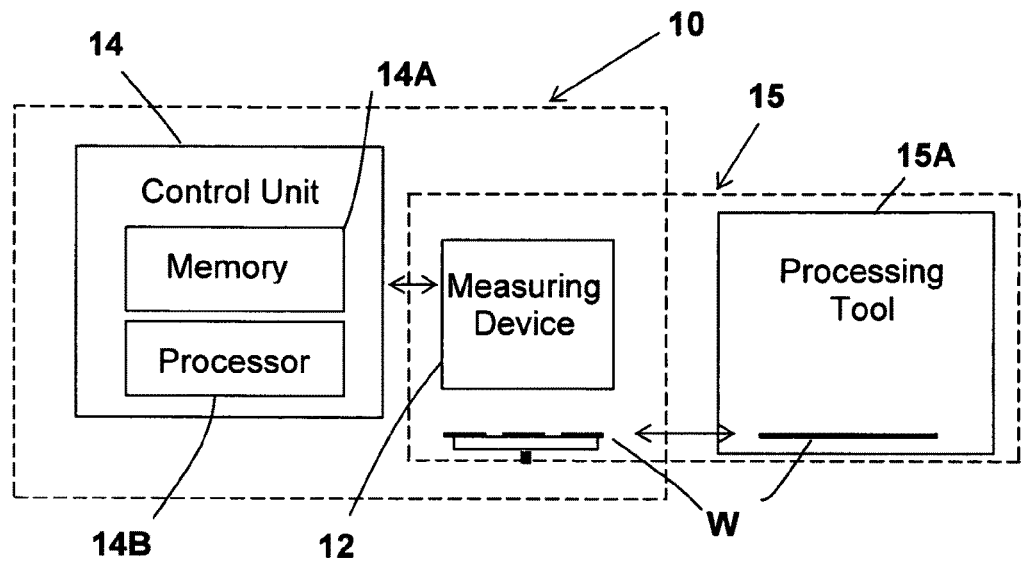
FIG. 1 is a schematic illustration of a system according to the invention for use in controlling processing of a multi-layer structure, such as a semiconductor wafer.

Referring to FIG. 1, there is schematically illustrated a system 10 of the present invention for controlling the processing of a multi-layer structure (e.g., semiconductor wafer) W by a processing tool 15A of a processing system 15. The system 10 comprises such main constructional parts as a measuring device (e.g., optical device) 12 and a control unit 14 connectable thereto. The control unit 14 is a computer system including inter alia a memory utility 14A and a data processing and analyzing utility 14B.

As shown in the specific but non-limiting example of FIG. 1, the system 10 is of the integrated type, is accommodated within the processing system 15 in the vicinity of the processing tool 15A, but outside the processing area defined by this tool. The control unit 14 is connectable to the processing tool (either directly or via a control unit of the processing system that operates this processing tool), and operates for analyzing measured data coming from the optical device 12 and generating an output indicative of the data analysis results to be used in operating the processing tool. The operation of the system 10 and its control unit 14 will be described further below.

The construction and operation of the optical device 12 do not form part of the present invention, and, generally, this device may be of any suitable design capable of providing accurate layer thickness measurements or topological profile measurements of a multi-layer structure. For example, the optical device may utilize spectrophotometric and imaging channels.

Figure 2:
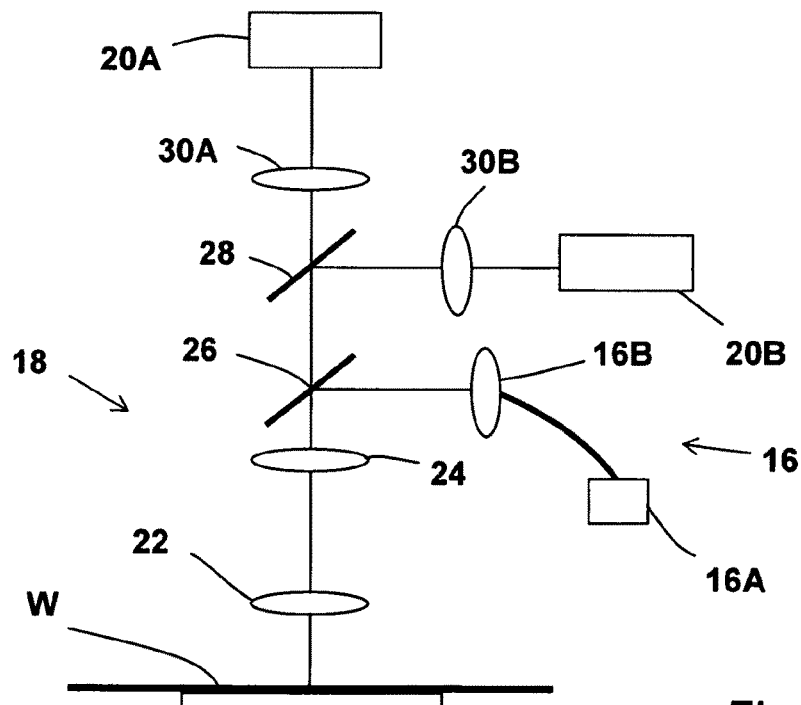
FIG. 2 exemplifies the construction of an optical device in the system of FIG. 1.

One specific but non-limiting example of such an optical device is that disclosed in U.S. Pat. No. 6,045,433, assigned to the assignee of the present application. This device implementation is schematically illustrated in FIG. 2. In this specific example, the optical device 12 utilizes a microscope-based spectrophotometer. The device comprises a light source arrangement 16, including a light emitting unit 16A and a condenser 16B; a detector assembly including a spectrophotometer 20A with its associated imaging optics 30A (e.g., relay lens) and an imaging detector 20B (e.g., CCD camera) with its associated imaging optics 30B (e.g., relay lens); and a light directing assembly 18. The latter defines spectrophotometric and imaging light propagation channels, and comprises a lens arrangement formed by an objective lens 22 and a focusing lens 24; a beam splitter 26; and a pinhole mirror 28.

Light from the light source 16A is provided (e.g., along an optical fiber) to the condenser 16B, which directs the light towards the beam splitter 26. The latter directs the light towards the wafer surface W via lenses 24 and 22.

Light returned (reflected or scattered) from the wafer is collected by objective 22 and focused by lens 24 onto the pinhole mirror 28. A portion of this light impinging onto the pinhole mirror 28 passes through the hole in this mirror and is focused by the relay lens 30A onto the spectrophotometer 20A. The other portion of light impinging onto the pinhole mirror 28 is reflected therefrom towards the relay lens 30B that focuses this light onto the CCD camera 20B. Since the pinhole is placed at the center of the image plane, which is the focal plane of the lens 24, it acts as an aperture stop, allowing only the collimated portion of the light beam to pass through. Thus, the pinhole drastically reduces any scattered light in the system. Relay lens 30A collects the light from the pinhole and provides it to spectrophotometer 20A. Furthermore, since the pinhole is located at the image plane of the optical imaging system (lenses 22 and 24), only that portion of the light, reflected from the wafer's surface, which is the size of the pinhole divided by the magnification will come through the pinhole. Relay lens 30B collects this light and focuses it onto the CCD camera 20B. The pinhole serves to locate the measurement spot in the image of the wafer. Since the pinhole allows light to pass through it, rather than being reflected toward the CCD camera 20B, the pinhole appears as a sharp dark point in the image produced by the lens 30B. Thus, when viewing the CCD image, the location of the measurement spot is immediately known, it being the location of the dark spot.

Figure 3A:
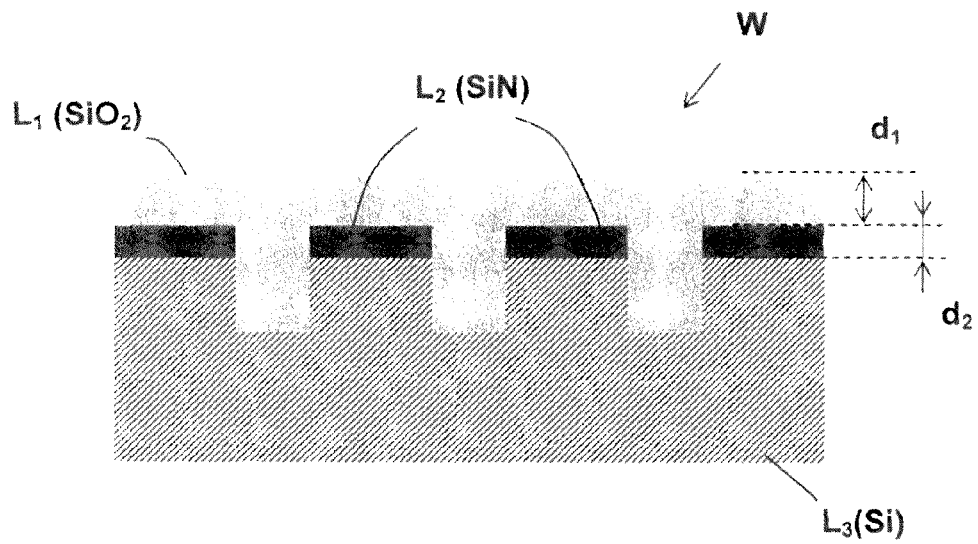
FIGS. 3A and 3B illustrate one possible example of a process to be controlled by the technique of the present invention.
Figure 3B:
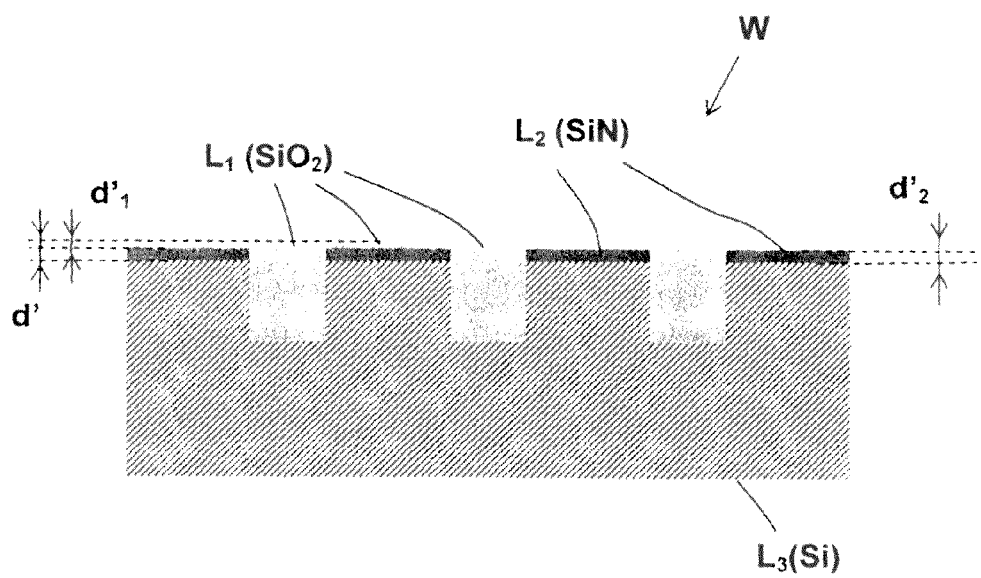

FIGS. 3A and 3B schematically illustrate one example of a process to be controlled while manufacturing multi-layer structures, such as semiconductor wafers. In this example, a wafer W is partly shown prior to and after a material removal process (polishing, e.g., CMP). In this specific example, monitoring STI (shallow trench isolation) is considered, and the wafer W includes three layers-Silicone Oxide ($SiO_2$) layer $L_1$, Silicon Nitride ($Si_3N_4$) layer $L_2$ and Si layer $L_3$. The processing consists in removing the uppermost layer material $L_1$ from the upper surface of layer $L_2$. As shown in FIG. 3B, the processed wafer W may have a thin layer of $SiO_2$ residuals.

The process control in this case is aimed at determining the existence of residuals of the layer material $L_1$ and/or the thickness of the remaining Silicon Nitride ($Si_3N_4$) layer $L_2$. To this end, the thickness of the layers $L_1$ and $L_2$ is to be measured after the polishing is complete, or is to be periodically or continuously measured during the polishing (in-situ), as the case may be.

The standard approach for controlling the process of layer $L_1$ removal consists of performing only post-polishing (or in-polishing) spectrophotometric measurements, and analyzing the so-obtained measured spectrum to understand the two thickness values $d'_1$ and $d'_2$ of, respectively, the Silicon Oxide layer $L_1$ residues and the Silicon Nitride layer $L_2$ forming (total) processed structure with thickness d'. The data analysis is based on data interpretation for both the Silicon Nitride layer and the Silicon Oxide residues via Merit Function (MF) calculation for regression fit.

It appears that the standard post-polishing spectrophotometric measurement is complicated and practically impossible in the case where the thickness of layer $L_1$ is too small and/or the layers $L_1$ and $L_2$ have very similar optical properties with respect to incident radiation used in optical measurements. Practically, the standard approach is incapable of distinguishing the layer of Silicone Oxide of less than 100 thickness from the underneath Silicon Nitride layer. In a typical example, the wafer stack after polishing includes 0 Å Silicon Oxide layer $L_1$, 970 Å Silicon Nitride layer $L_2$ and a lower 80 Å Pad Oxide/Si layer $L_3$. The limitation in this case comes from the fact that the basic discrimination of each of these transparent layers is proportional to a product (n·d), wherein n is the refraction index of the respective layer. So, measuring ($n_1 \cdot d_1 + n_2 \cdot d_2$) for $d_2 \ll d_1$ is problematic, as long as these parameters satisfy the following relation:

$$n_2 \cdot d_2 \ll (n_1 \cdot d_1 + n_2 \cdot d_2)$$

The rate of MF change vs. thickness change for each material presents the sensitivity of the regression fit to this parameter. It appears that there is no sensitivity to small Silicon Oxide thickness, while for the Silicon Nitride thickness, the rate of change is much sharper.

The present invention solves the above problem by utilizing data indicative of optical measurement results on the wafer W prior to be processed (pre-process measurement) for the analysis of an after-process measurement. This pre-process measured data can be provided either by applying optical measurements to a wafer arrived for the specific processing, or by utilizing after-process measured data associated with a prior manufacturing step. In this specific example of material removal of layer $L_1$, such a pre-process measurement may be that obtained after completing the deposition of this layer $L_1$, for example, previously obtained for the purposes of controlling the deposition process.

As indicated above, the post-polishing measurement of ($n_1 \cdot d_1 + n_2 \cdot d_2$) for $d_2 \ll d_1$ is problematic as long as $n_2 \cdot d_2 \ll (n_1 \cdot d_1 + n_2 \cdot d_2)$. This condition, however, is not valid for a pre-polishing state (or after-deposition state), and this measurement can be accurately executed using the interpretation of both parameters simultaneously, since each layer thickness significantly affects the measured spectrum. For a typical situation of the stack comprising 4840 Å Silicon Oxide layer $L_1$, 960 Å Silicon Nitride layer $L_2$ and 80 Å STI Pad Oxide/Si layer $L_3$, the MF slopes for the thicknesses of layers $L_1$ (Oxide) and $L_2$ (Nitride) are significantly high, thus ensuring good convergence sensitivity for both parameters. The mutual effect of one thickness on the other thickness is minor and good accuracy can be achieved even for simultaneous data interpretations. Hence, according to the technique of the present invention, data indicative of thicknesses $d_1$ and $d_2$ of layers $L_1$ and $L_2$, respectively, are determined in the pre-polishing state of the wafer W, and then data indicative of thickness $d_2$ is "injected" to the interpretation of the post-polishing measurement.

Figure 4:
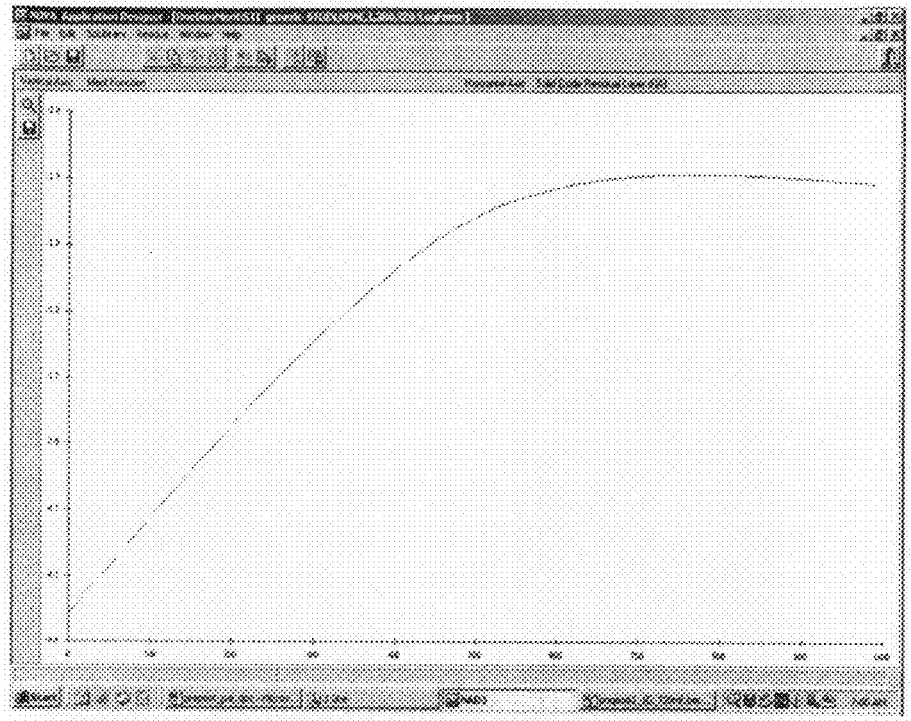
FIG. 4 presents a one-dimensional Merit Function (MF) plot, as MF vs. layer thickness in the structure of FIGS. 3A-3B.

FIG. 4 presents a one-dimensional MF plot, namely, MF vs. Silicon Oxide thickness (layer $L_1$ in FIG. 3). The minimum of this function at zero thickness is well defined. The Nitride layer thickness $d'_2$ at the after-polishing state of the wafer can be easily and accurately interpreted using optical measurements at the pre-polishing state of the wafer. By this, ambiguity regarding small errors in the Silicon Nitride thickness and large errors in the Silicon Oxide thickness can be avoided.

Figure 5:
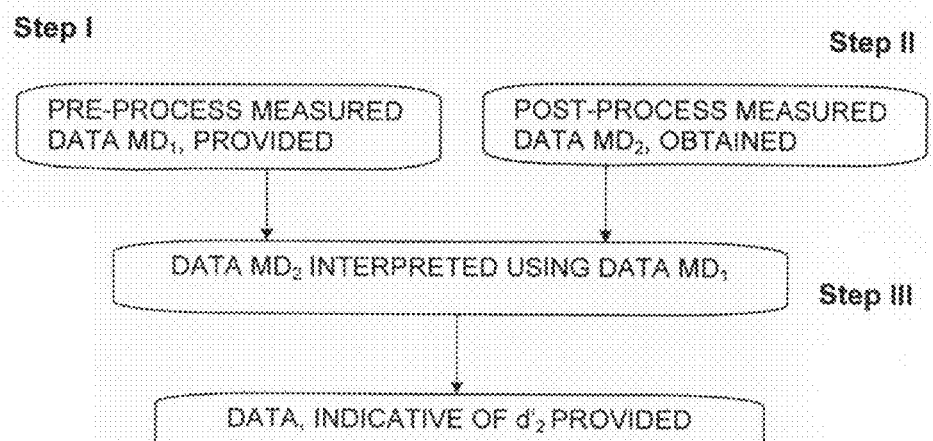
FIG. 5 illustrates a block diagram of a method according to the invention.

Turning back to FIG. 1 and referring to FIG. 5 illustrating a block diagram of a method according to the invention, the system 10 according to the invention operates in the following manner.

Measured data $MD_1$ (constituting first measured data), obtained by applying optical measurements to the wafer W prior to be processed by the tool 15A, is provided (Step I). The first pre-process measured data $MD_1$, is indicative of thicknesses $d_1$ and $d_2$ of layers $L_1$ and $L_2$, respectively.

This data $MD_1$ may be obtained while controlling a previous manufacturing process of depositing layer $L_1$ onto layer $L_2$ (e.g., CVD process). In this case, measured data $MD_1$, for controlling the polishing process, presents reference data previously supplied to the control unit 14 and stored in its memory utility 14A. Alternatively, or additionally, the first measured data $MD_1$ is obtained when the wafer W arrives to the polishing system 15. In this case, considering the integrated implementation of the system 10 (e.g., utilizing the same wafer transfer means of the processing system 15), the wafer W to be processed by the processing tool 15A is first supplied to a measurement area defined by the optical device 12. The control unit 14 operates the optical device 12 to apply optical measurements to at least selected sites of the wafer W and generate first measured data $MD_1$, indicative of the thicknesses $d_1$ and $d_2$ of layers $L_1$ and $L_2$, respectively. This measured data $MD_1$ is received at the control unit 14 and stored in the memory utility 14A.

The processed (polished) wafer W is supplied to the measurement area defined by the optical device 12. The control unit 14 operates the optical device 12 to apply a post-process optical measurement and generate second measured data $MD_2$ (Step II). This second measured data $MD_2$ is indicative of a thickness d' of a structure after processing, including thickness $d_2'$ of layer $L_2$ and layer material $L_1$ with thickness $d_1'$ that might remain on top of layer $L_2$. The control unit 14 analyzes the first and second measured data to discriminate between optical parameters that have non-orthogonal contribution to the optical measurement and determine at least the thickness $d_2'$ of layer $L_2$ in the processed wafer (Step III). Since the thickness of layer $L_2$ has not been affected by the polishing and therefore remains the same as in the pre-process state of the wafer, the so-obtained data indicative of the thickness of layer $L_2$ in the processed wafer is indicative of the thickness $d_1'$ of layer material $L_1$ on top of layer $L_2$ in the post-process wafer state, and is thus indicative of the quality of polishing, namely, whether the working parameters of the polishing tool are to be corrected or not. The control unit 14 thus generates a control signal indicative of the data analysis results to be used in operating the processing tool accordingly.

Figure 6:
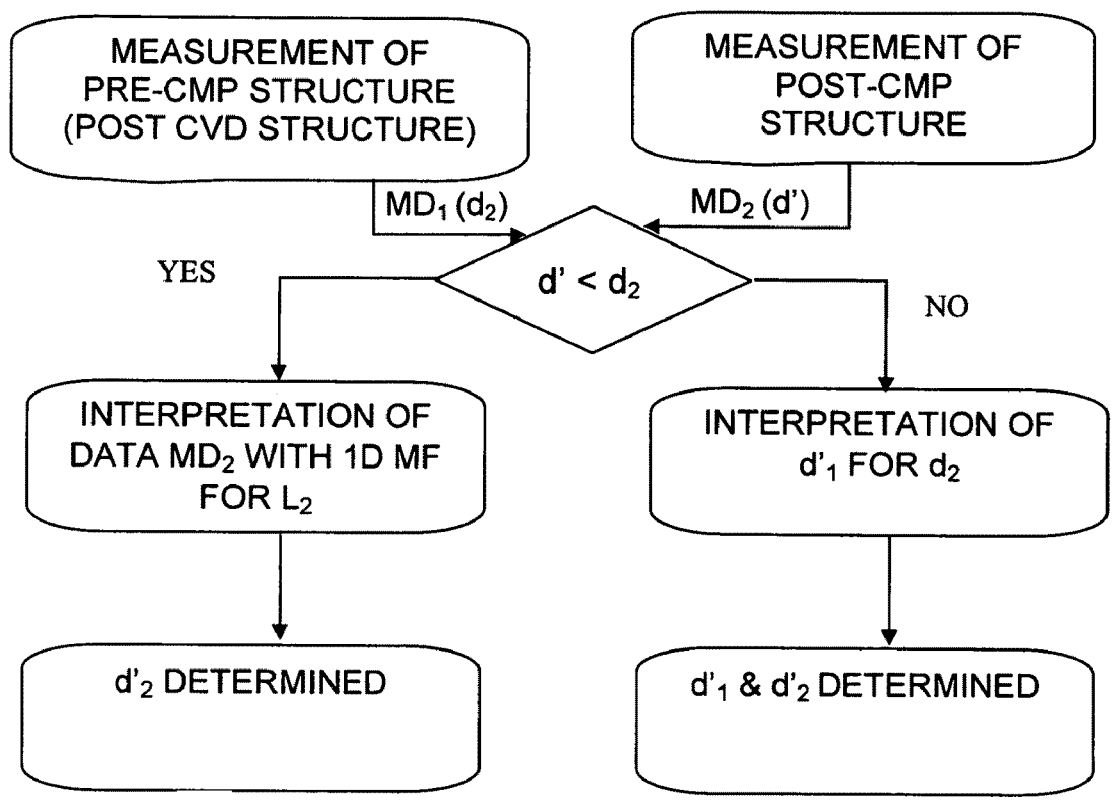
FIG. 6 exemplifies the operational steps of a processor utility of the system according to the invention while processing and analyzing the first and second measured data obtained with respectively pre-process and after-process measurements.

FIG. 6 exemplifies the operational steps of the processor utility (14B in FIG. 1) while processing and analyzing the first and second measured data $MD_1$ and $MD_2$. In this specific example, the polishing is aimed at complete removal of layer $L_1$ and partial removal of layer $L_2$. For example, the case may be such that material $L_1$ is deposited on the patterned surface of layer $L_2$ to fill grooves in layer $L_2$. As indicated above, first measured data $MD_1$ is not necessarily obtained just prior to applying to the wafer a specific process to be controlled. In the case of controlling a polishing process, first pre-processed measured data $MD_1N$ might be that obtained during the control of a previous CVD process applied to the same wafer, and thus the pre-process measured data $MD_1$ for polishing process presents a post-process measured data for the deposition process. Second measured data $MD_2$ is that obtained from optical measurements applied to at least selected sites of the polished wafer, provided these sites have been measured in a pre-polished state of the wafer. With regard to the post-polishing measurement, it is assumed that there is no layer $L_1$ on top of layer $L_2$, and thus data $MD_2$ indicative of the thickness value d'obtained in the post-polishing measurement is to be compared to data $MD_1$ indicative of the layer $L_2$ thickness $d'_2$ at the pre-polished state of the wafer.

The processor utility thus identifies whether data $MD_1$ and $MD_2$ are indicative of that thickness d' at the post-polish state is below the pre-polished thickness $d_2$ or not. To this end, a certain predetermined threshold is considered defined by an acceptable error for the pre-polishing measurement (about 5 Å). If d' is smaller than $d_2$, the difference between d' and $d_2$ is interpreted using a one-dimensional function of MF vs. Nitride thickness, thereby enabling the determination of thickness $d'_2$ in the polished wafer, i.e., the measurement is finished by presenting the Silicon Nitride actual thickness result $d'_2$ and zero Silicon Oxide thickness residual $d'_1$ (i.e. no residuals). If the measured thickness d' is equal or higher than $d_2$ of the pre-polished wafer, the second measured data is interpreted for the Silicon Oxide layer with the known pre-polishing Silicon Nitride thickness $d_2$, thereby enabling the determination of both Nitride and Oxide layers' thicknesses $d'_1$ and $d'_2$ in the post-polished wafer.

The above technique of the present invention can advantageously be used for controlling a Physical Vapor Deposition process (PVD) of thin metal films. In this case, the measurement on a structure in a pre-process state could provide data that otherwise, due to measurement limitations, cannot be measured by the standard techniques. Such a pre-process measurement could provide a set of starting condition for a further measurement (e.g., thickness of underlying layers) to improve the interpretation of the further measurement. A typical example of this application is measuring in multi stacks of thin metals layers using optical methods. By additions of metal deposition steps, the metal stack layers can become practically opaque. Therefore, measuring in thin metal layers prior to an additional layer deposition step enables to achieve better accuracy measurement, and may actually determine the need for such type of measurements. Simultaneous layer thickness measurements in a structure formed by two thin metal layers might be impeded by error contribution from one metal to the other metal (due to diffusion effects at the interface between these layers). An example of such a structure is that formed by Tungsten (W) and Tungsten Nitride (WN) films, where the mutual contribution from W film to WN film is of the level of a few angstroms. The present invention provides for eliminating any additional contributions and having better repeatability for each of the layer thickness measurements in the W/WN stack by measuring the metal layer thickness after each deposition layer deposition process and utilizing these measurement results to control the deposition of a further layer. For example, the calculation has shown an improvement in the repeatability from 2.5 Å to 1.1 Å for the upper layer.

Figure 7A:
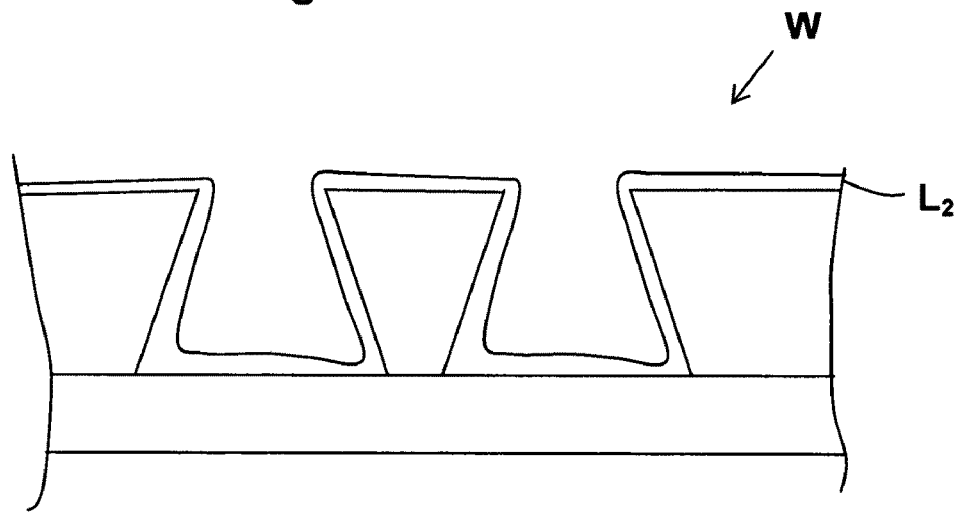
FIGS. 7A and 7B illustrate another example of a process to be controlled by the technique of the present invention.
Figure 7B:
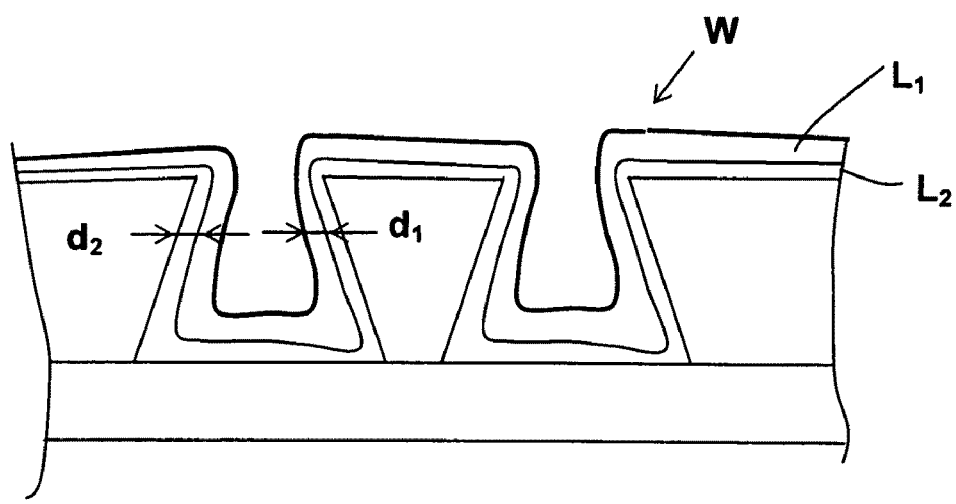

Reference is now made to FIGS. 7A and 7B, illustrating yet another example of a process to be controlled while manufacturing multi-layer structures, such as semiconductor wafers. In this example, a wafer W is shown prior to and after a material $L_1$ deposition process (e.g., Sputtering or CVD) onto a patterned surface of layer $L_2$ having trenches, holes, etc. The technique of the present invention provides for advantageously controlling this material deposition process by providing measured data from the preprocessed wafer (FIG. 7A) and utilizing this pre-deposition measured data for interpreting measured data from the post-processed wafer (FIG. 7B). The measurements are preferably based on scatterometry.

In that case, the basic sensitive capability is the measurement of shape of features (topological profile) covered by metal deposition. The scatterometry technique could not resolve with the required accuracy, parameters of metal thickness (for layers thicker than few hundreds angstroms), and especially the thickness of the metal layer covering the sidewalls. However, its sensitivity to shape parameters such as trench slopes, trench depth, trench opening (CD top), is extremely higher. In this case, these shape parameters could be measured with very good repeatability and accuracy.

More specific is the case of the barrier and seed layers deposition step that is a preliminary step for electroplating in the Damascene process. Each metal deposition process is a stage for a shape measurement based on the very sensitive parameters. Accurate and repeatable measurements on the same site prior and after each deposition step can yield different shapes, whose subtraction presents an actual thickness of the layer that has been deposited in this process step.

The present invention may be used for controlling various deposition steps by measuring layers' parameters (e.g., thickness) prior to and after the deposition. The structure profile (shape) is measured prior to the barrier layer $L_1$ deposition on the structure, and the first measured data (profile) indicative of this pre-deposition measurement is generated. After completing the barrier layer deposition process, a measurement of the structure profile in the same measurement site is performed, and second measured data indicative of the post-deposition structure profile is generated. The actual thickness of the deposited layer is calculated as a difference between the second and first profiles. It should be noted, that actually the first measurement (constituting a pre-process measurement for the deposition process) could be performed after completing the step of trench etching, e.g., using a measurement system integrated with the etcher tools arrangement. The second measurement, constituting the post-deposition measurement for one layer, could be performed as a pre-process measurement for the seed layer deposition process. A similar technique could be applied for the control of the seed layer deposition process. In that case, the first measurement is performed prior to the seed deposition step (or after barrier layer deposition) and the second step is performed after completing the seed layer deposition (or prior to step of electroplating).

Process control for electroplating providing information on the metal layer thickness in all direction sidewalls, and bottom of the trench also could be provided in accordance with the present invention. In that case, the first measurement is performed prior to the electroplating step (or after seed layer deposition) and the second step is performed after completing the step of electroplating (or prior to the step of polishing or photolithography). Such process control for electroplating enables to eliminate or at least significantly reduce void or non-sufficient coverage problems.

The Table presented below illustrates the analysis of such capability for pre- and post-seed layer deposition measurement. Presented is a calculation that was done using repeatability data retrieved from an optical scatterometry tool that gives data for the CD top and sidewall slopes of the trench that was covered with a metal layer. In this calculation, the maximal error that can be caused by the subtraction of two shapes (pre-seed and post-seed deposition) measured by scatterometry is analyzed.

| Error of pre-process + post-process measurement Seed with measured barrier problems | Measurement of pre-processing error Barrier error | Measurement in post-process state for known pre-process profile SEED for known barrier profile | |
|---|---|---|---|
| 0.288 | 0.144 | 0.144 | Contribution of reference point error "CD top" - STDEV[nm] |
| 1.903 | 0.951 | 0.951 | Error due to slope contribution - STDEV[nm] |
| 2.191 | 1.095 | 1.095 | Worse error for any point across profile - STDEV[nm] |
| 8.15% | 4.08% | 4.08% | Worse error for any point across profile - STDEV [% of seed thickness] |

Thus, the present invention can advantageously be used for controlling the processing a multi-layer structure, such as a semiconductor wafer. The process to be controlled may be a layer deposition or layer removal process. The measurements preferably utilize optical means but, generally, any other kind of measurements can be used, provided they are capable of providing data indicative of thickness and/or surface profile of a structure under measurements.

Those skilled in the art will readily appreciate that many modifications and changes may be applied to the invention as hereinbefore exemplified without departing from its scope, as defined in and by the appended claims.

The invention claimed is:

1. A method for use in process control of manufacture of multilayer patterned structure, the method comprising:
providing first measured data indicative of a thickness of at least one layer in a selected site thereof, said at least one layer being an underneath layer located on a patterned structure prior to deposition of an uppermost layer of the structure under processing;
applying spectral optical measurement to said selected site after the deposition of said uppermost layer, and generating second measured data indicative of a spectral response of said selected site;
analyzing the second measured data using the first measured data, and generating output data comprising at least a thickness of said uppermost layer, said output data being indicative of quality of said process of the manufacture of the patterned structure.

2. The method of claim 1, wherein the first measured data is provided by applying optical measurement to the structure being manufactured.

3. The method of claim 2, wherein said optical measurement comprises a scatterometric measurement.

4. The method of claim 2, wherein said optical measurement comprises a normal incidence scatterometric measurement.

5. The method of claim 2, wherein said optical measurement for providing said first measured data and said spectral optical measurement for providing said second measured data are performed by an integrated metrology tool.

6. The method of claim 1, wherein said spectral optical measurement comprises a scatterometric measurement.

7. The method of claim 1, wherein the first measured data comprises reference data obtained while controlling a previous processing step applied to the structure.

8. The method of claim 1, wherein said underneath layer is a layer covering sidewalls of the patterned structure.

9. The method of claim 8, wherein said uppermost layer is a layer covering sidewalls of the patterned structure.

10. The method of claim 1, wherein said spectral optical measurement is performed by an integrated metrology tool.

11. The method of claim 1, wherein a material composition of at least one of said uppermost and underneath layers is of the kind capable of diffusing into the other within an interface between said layers.

12. The method of claim 1, wherein said output data is further indicative of a surface profile of the patterned structure.

13. The method of claim 1, wherein said at least one underneath layer is substantially optically transparent.

14. The method of claim 13, wherein said uppermost layer is either substantially optically transparent or optically opaque.

15. The method of claim 1, wherein said uppermost layer is either substantially optically transparent or optically opaque.

16. The method of claim 1, wherein the first measured data is further indicative of a surface profile of the patterned structure.

17. The method of claim 1, wherein said process comprises at least partial removal of one or more layers deposited on the patterned structure.

* * * * *